US008227785B2

(12) United States Patent
Erbetta

(10) Patent No.: US 8,227,785 B2
(45) Date of Patent: Jul. 24, 2012

(54) CHALCOGENIDE CONTAINING SEMICONDUCTORS WITH CHALCOGENIDE GRADIENT

(75) Inventor: Davide Erbetta, Trezzo sull'Adda (IT)

(73) Assignee: Micron Technology, Inc., Boise, ID (US)

( * ) Notice: Subject to any disclaimer, the term of this patent is extended or adjusted under 35 U.S.C. 154(b) by 83 days.

(21) Appl. No.: 12/944,119

(22) Filed: Nov. 11, 2010

(65) Prior Publication Data

US 2012/0119177 A1   May 17, 2012

(51) Int. Cl.
*H01L 47/00* (2006.01)
*H01L 29/04* (2006.01)
*H01L 29/06* (2006.01)
*H01L 21/00* (2006.01)
*H01L 21/06* (2006.01)

(52) U.S. Cl. ............ 257/2; 257/4; 257/5; 257/E31.029; 257/E45.002; 438/95; 438/102

(58) Field of Classification Search ............... 257/2, 4, 257/5, E31.029, E45.002; 438/95, 102
See application file for complete search history.

(56) References Cited

U.S. PATENT DOCUMENTS

| | | | | |
|---|---|---|---|---|
| 5,341,328 A * | 8/1994 | Ovshinsky et al. | ........... | 365/163 |
| 5,687,112 A * | 11/1997 | Ovshinsky | ................. | 365/163 |
| 5,789,758 A * | 8/1998 | Reinberg | .............. | 257/3 |
| 6,813,178 B2 * | 11/2004 | Campbell et al. | ............. | 365/148 |
| 6,815,266 B2 * | 11/2004 | Rodgers et al. | .............. | 438/133 |
| 7,348,209 B2 * | 3/2008 | Campbell | ..................... | 438/102 |
| 7,667,218 B2 * | 2/2010 | Yamamoto et al. | ................ | 257/3 |
| 7,936,593 B2 * | 5/2011 | Savransky | ..................... | 365/163 |
| 2003/0228717 A1 * | 12/2003 | Li et al. | .......................... | 438/95 |
| 2007/0029676 A1 * | 2/2007 | Takaura et al. | ............... | 257/758 |
| 2008/0121859 A1 * | 5/2008 | Campbell | ......................... | 257/2 |
| 2010/0328996 A1 * | 12/2010 | Shih et al. | ..................... | 365/163 |
| 2011/0214725 A1 * | 9/2011 | Beck | ............................ | 136/255 |
| 2011/0215288 A1 * | 9/2011 | Matsui et al. | .................... | 257/2 |

OTHER PUBLICATIONS

Lee et al., "Efffect of thermal annealing on microstructural properties of Ti/Ge2Sb2Te5/Ti thin films deposited on Sio2/Si substrates by a sputtering method", Feb. 15, 2007, Applied Surface Science vol. 253, No. 8, p. 4041-4.*

* cited by examiner

*Primary Examiner* — Charles Garber
*Assistant Examiner* — Ron Pompey
(74) *Attorney, Agent, or Firm* — Dorsey & Whitney LLP

(57) ABSTRACT

Chalcogenide containing semiconductor devices may be formed with a gradient film between a chalcogenide film and another film. The gradient film may have its chalcogenide concentration decrease as it extends away from the chalcogenide film, while the concentration of the other film material increases across the thickness of the gradient film moving away from the chalcogenide film.

20 Claims, 1 Drawing Sheet

CHALCOGENIDE CONTAINING SEMICONDUCTORS WITH CHALCOGENIDE GRADIENT

BACKGROUND

This relates generally to chalcogenide containing semiconductors including phase change memories and ovonic threshold switches.

Chalcogenide containing semiconductors include a chalcogenide layer that interfaces with other layers. Traditionally, the adhesion between chalcogenide and other adjacent layers is problematic. Chalcogenides adhere well to pure metals, but pure metals result in high chalcogenide film contamination, causing unwanted doping and chalcogenide material failures. Thus, metal composites, such as metal nitrides, are generally utilized in adjacent layers.

A phase change memory includes chalcogenide that changes between more amorphous and less amorphous (i.e. more crystalline) phases to store information. An ovonic threshold switch may be used as a select device in a phase change memory. The chalcogenide in the switch generally remains in an amorphous phase.

DETAILED DESCRIPTION

Figure 1:
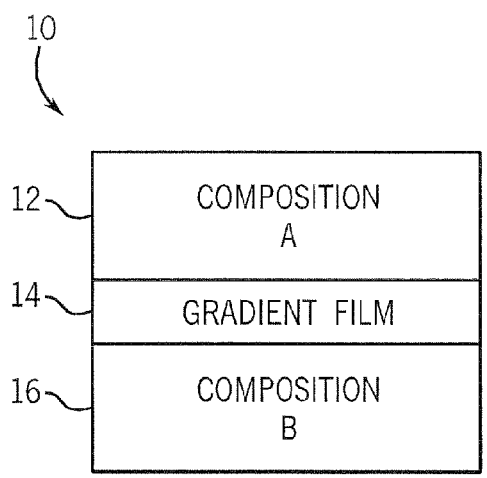
FIG. 1 is an enlarged, simplified cross-sectional view of a chalcogenide containing semiconductor device in accordance with one embodiment.

Referring to FIG. 1, a chalcogenide containing semiconductor device 10 may include a first compositional layer 12, a second compositional layer 16, and an intermediate gradient film made up of a mixture of the compositions of the films 12 and 16. At least one of the films 12 or 16 includes a chalcogenide. The chalcogenide, for example, may be germanium, antimony, tellurium (GST) and the device 10 may be a phase change memory. As another example, the chalcogenide may be a chalcogenide generally utilized in connection with ovonic threshold switches, which normally remains in the amorphous phase. Thus, the chalcogenide film may be the film 12, which is on top of another film 16, or the chalcogenide film may be below another film, in which case it would be represented by the film 16.

For example, when the chalcogenide film 16 is below another film, the other film 12 may be an electrode, such as a metal nitride film. Similarly, when the chalcogenide film 12 is above another film 16, again, the other film 16 may be an electrode or heating layer that provides Joule heating of the chalcogenide to change its phase.

In addition, the chalcogenide film 12 or 16 may interface with insulator films 12 or 16, such as silicon dioxide or silicon nitride. These insulator films may be above or below the chalcogenide film in some instances. In other cases, the chalcogenide film 12 or 16 may interface with a pure metal interfacial film, such as a titanium film, to improve adhesion between the chalcogenide film and other films, such as metal nitrides, insulators, and substrates, etc.

Figure 2:
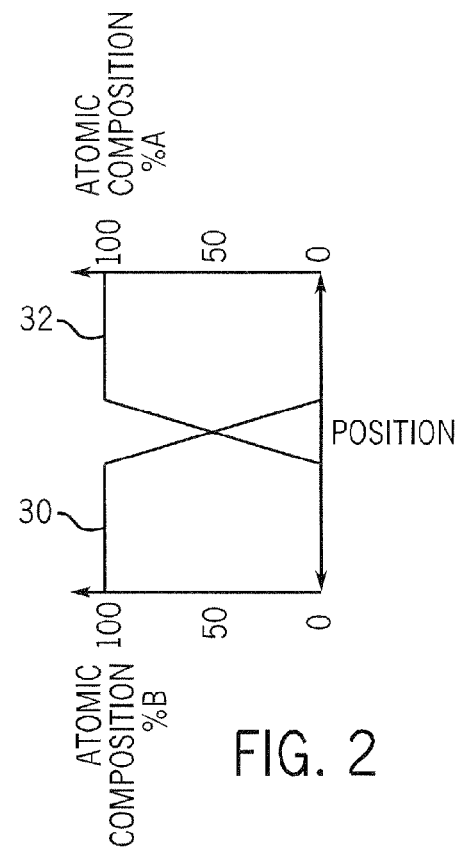
FIG. 2 is a graph of composition versus cross-section across the device shown in FIG. 1 in accordance with one embodiment.

As indicated in FIG. 2, the adhesion between the films 12 and 16 may be improved by providing an intervening gradient film 14 whose composition varies from entirely composition B, adjacent the composition B film 16, to entirely composition A at the interface between the film 14 and the composition A film 12. In one embodiment, the transition in atomic composition may be linear with fifty atomic percent at each at the exact center of the gradient film. Other non-linear gradients may be utilized as well. In addition, stepwise gradients, curved gradients, and gradients that are not centered or regular across the film 14 may be utilized, so that the fifty percent atomic composition point may be non-centered in the gradient film 14, to mention a few examples.

In order to form the structure 10, shown in FIG. 1, a chalcogenide bulk film may be deposited by standard argon sputtering, for example. Then a deposition step may create the gradient film 14. For example, there may be an introduction and increase of nitrogen gas content in the sputter chamber up to a typical value for reactive sputtering of metal to form metal nitride, such as titanium nitride, as the film 12. Then there is a decrease in chalcogenide sputtering power down to zero as the gradient film 14 grows. At the same time, there is an increase of titanium sputtering power from zero to the typical value for titanium nitride deposition, as well as an adjustment of argon composition from the chalcogenide only layer to the titanium nitride only layer. This creates a film 14 with a continuous gradient of composition from chalcogenide to titanium nitride. Then, conventional titanium nitride sputtering may proceed.

Similarly, a chalcogenide may be deposited on a dielectric film 16, such as silicon dioxide or silicon nitride. For example, an incoming wafer may have mainly silicon oxide and silicon nitride exposed in a titanium silicon nitride heater material. Prior to chalcogenide bulk deposition, a thin film 14 with a gradient is deposited, including physical vapor deposition sputtering of silicon. The silicon may ensure good adhesion on all exposed materials, including silicon dioxide, silicon nitride, and titanium silicon nitride. After a very few nanometers of deposition of the gradient film 14, the silicon sputtering source may be reduced down to zero to stop the silicon deposition. In the meantime, the chalcogenide sputtering power switched on and increased up to its typical value for chalcogenide sputtering. Thereafter, only chalcogenide is deposited to form the film 12. Then a standard capping layer is performed or, again, with a gradient, as described above.

Figure 3:
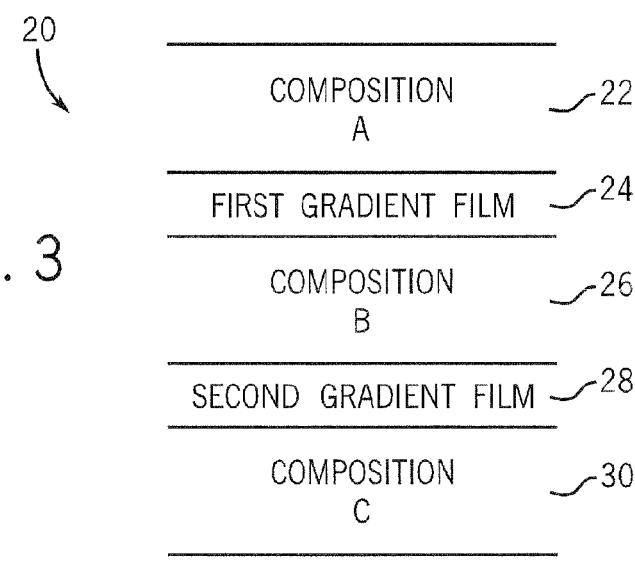
FIG. 3 is an enlarged, simplified cross-sectional view of still another embodiment.

Thus, in some embodiments, as indicated in FIG. 3, there may be multiple gradient films utilized. For example, where the composition B film 26 is chalcogenide, it may have the first gradient film 24 above it and a second gradient film 28 below it. Depending on the composition A film 22 and the composition C film 30, the first and second gradient films may be different films. For example, the composition A film 22 may be titanium nitride, so that the first gradient film 24 has a gradient between chalcogenide and titanium nitride, while the composition C film 30 may be silicon or silicon dioxide, silicon nitride, or titanium silicon nitride and may include a gradient film in which the concentrations of those materials decrease across the gradient film and a concentration of chalcogenide increases across the gradient film.

In some embodiments, the gradient film is quite thin, less than five nanometers, and, in some embodiments, it is less than ten Angstroms.

Programming to alter the state or phase of the material may be accomplished by applying voltage potentials to the address lines, thereby generating a voltage potential across a memory element including a phase change material. When the voltage potential is greater than the threshold voltages of any select device and memory element, then an electrical current may flow through the phase change material in response to the applied voltage potentials, and may result in heating of the phase change material.

This heating may alter the memory state or phase of the material, in one embodiment. Altering the phase or state of the material may alter the electrical characteristic of memory material, e.g., the resistance or threshold voltage of the material may be altered by altering the phase of the memory material. Memory material may also be referred to as a programmable resistance material.

In the "reset" state, memory material may be in an amorphous or semi-amorphous state and in the "set" state, memory material may be in a crystalline or semi-crystalline state. The resistance of memory material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to melt and then quenched to vitrify and "reset" memory material in an amorphous state (e.g., program memory material to a logic "0" value). Heating the volume of memory material to a relatively lower crystallization temperature may crystallize or devitrify memory material and "set" memory material (e.g., program memory material to a logic "1" value). Various resistances of memory material may be achieved to store information by varying the amount of current flow and duration through the volume of memory material.

The ovonic threshold switch is either on or off depending on the amount of voltage potential applied across the switch and, more particularly, whether the current through the switch exceeds its threshold current or voltage, which then triggers the device into an on state. The off state may be substantially electrically non-conductive and the on state may be a substantially conductive state with less resistance than the off state.

In the on state, the voltage across the switch, in one embodiment, is equal to its holding voltage $V_{hold}+IR_{on}$, where $R_{on}$ is the dynamic resistance from the extrapolated X axis intercept $V_{hold}$. For example, an ovonic threshold switch may have a threshold voltage $V_{th}$ and, if a voltage potential less than the threshold voltage of the switch is applied across the switch, then the switch may remain off or in a relatively high resistance state so that little or no electrical current passes.

Alternatively, if a voltage potential greater than the threshold voltage of the select device is applied across the device, then the device may turn on, i.e., operate in a relatively low resistance state so that significant electrical current passes through the switch. In other words, one or more series connected switches may be in a substantially electrically non-conductive state at less than a predetermined voltage, e.g., the threshold voltage as applied across a switch. The switch may be in a substantially conductive state if greater than a predetermined voltage is applied across the switch.

In one embodiment, each switch may comprise a switch material that is a chalcogenide alloy. The switch material may be a material in a substantial amorphous state positioned between two electrodes that may be repeatedly and reversibly switched between a higher resistance off state that is generally greater than about 1 megaOhms and a relatively lower resistance on state that is generally less than about 1000 Ohms in series with the holding voltage by the application of electrical current or potential.

Each switch is a two-terminal device that has an IV curve similar to that of a phase change memory element that is in an amorphous state. However, unlike a phase change memory element, the ovonic threshold switch does not change phase. That is, the switching material of the ovonic threshold switch is not a phase programmable material and, as a result, the switch may not be a memory device capable of storing information. For example, the switching material may remain permanently amorphous and the IV characteristics may remain the same throughout the operating life.

In the low voltage, low electric field mode, where the voltage applied across the switch is less than the threshold voltage $V_{th}$, the switch may be off or non-conducting and exhibits a relatively high resistance. The switch may remain in the off state until a sufficient voltage, namely, the threshold voltage, is applied or a sufficient current is applied, namely, the threshold current, that switches the device to a conductive relatively low resistance on state. After a voltage potential of greater than about the threshold voltage is applied across the device, the voltage potential across the device may drop or snapback to a holding voltage $V_{hold}$. Snapback may refer to the voltage difference between the threshold voltage and the holding voltage of the switch.

In the on state, the voltage potential across the switch may remain close to the holding voltage as current passing through the switch is increased. The switch may remain on until the current through the switch drops below a holding current. Below this value, the switch may turn off and return to a relatively high resistance, non-conductive off state, until the threshold voltage and current are again exceeded.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    forming a chalcogenide containing semiconductor device with a gradient film between a chalcogenide and non-chalcogenide film, such that the concentration of chalcogenide changes across the thickness of the gradient film, wherein said gradient film includes both chalcogenide and non-chalcogenide material.

2. The method of claim 1 including forming said device with a gradient film with opposed sides, one side being adjacent the chalcogenide such that the concentration of chalcogenide decreases across the thickness of the film, moving away from the chalcogenide.

3. The method of claim 1 including forming a phase change memory.

4. The method of claim 1 including forming an ovonic threshold switch.

5. The method of claim 1 including forming the chalcogenide on one side of said gradient film and an electrode on the other side of said gradient film.

6. The method of claim 1 including forming the chalcogenide on one side of said gradient film and an insulator on the other side.

7. The method of claim 1 including forming the chalcogenide on one side of said gradient film and another film on the other side of said gradient film, the gradient film including a concentration of the material forming said another film, said concentration increasing across the thickness of the gradient film moving from the chalcogenide to the another film.

8. An apparatus comprising:
a chalcogenide layer;
a second layer in contact with said chalcogenide layer; and
a third layer, being non-chalcogenide, in contact with said second layer, the second layer including chalcogenide and material also forming said third layer, the concentration of said chalcogenide decreasing moving through the second layer and away from the chalcogenide layer.

9. The apparatus of claim 8 wherein said apparatus is a phase change memory.

10. The apparatus of claim 8 wherein said apparatus is an ovonic threshold switch.

11. The apparatus of claim 8 wherein the concentration of said material increases in the second layer moving from the chalcogenide to said third layer.

12. The apparatus of claim 8 wherein the atomic percent of chalcogenide in said second layer decreases linearly from the chalcogenide to the third layer.

13. The apparatus of claim 8 including a fourth layer on said chalcogenide layer on the opposite side of said chalcogenide layer from said second layer, said apparatus including a fifth layer on said fourth layer, the concentration of chalcogenide in said fourth layer decreasing across the thickness of said fourth layer moving from said chalcogenide layer to said fifth layer.

14. The apparatus of claim 8 wherein the thickness of said second layer is less than five nanometers.

15. The apparatus of claim 14 wherein the thickness of said second layer is less than ten Angstroms.

16. A chalcogenide containing semiconductor comprising:
a chalcogenide layer;
a non-chalcogenide layer; and
an intervening layer between said non-chalcogenide layer and said chalcogenide layer, said intervening layer including a mixture of chalcogenide and material making up the non-chalcogenide layer.

17. The device of claim 16 wherein said non-chalcogenide layer is an insulator.

18. The device of claim 16 wherein said non-chalcogenide is a conductor.

19. The device of claim 16 wherein the concentration of chalcogenide decreases linearly across said intervening layer moving from said chalcogenide layer to said non-chalcogenide layer.

20. The device of claim 19 wherein the concentration of non-chalcogenide increases linearly moving from said chalcogenide layer to said non-chalcogenide layer across said intervening layer.

* * * * *